United States Patent
Okano

(10) Patent No.: US 8,013,691 B2
(45) Date of Patent: Sep. 6, 2011

(54) DEVICE AND CONNECTING METHOD FOR CONNECTING POWER-SUPPLY TERMINALS TO A POWER-SUPPLY BUS BASED ON NOISE INTENSITIES

(75) Inventor: Takashi Okano, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 251 days.

(21) Appl. No.: 12/224,133

(22) PCT Filed: Feb. 28, 2007

(86) PCT No.: PCT/JP2007/053758
§ 371 (c)(1),
(2), (4) Date: Aug. 19, 2008

(87) PCT Pub. No.: WO2007/102366
PCT Pub. Date: Sep. 13, 2007

(65) Prior Publication Data
US 2009/0058558 A1 Mar. 5, 2009

(30) Foreign Application Priority Data
Mar. 1, 2006 (JP) .................................. 2006-054742

(51) Int. Cl.
*H03H 7/00* (2006.01)
(52) U.S. Cl. ........................................ 333/181; 333/185
(58) Field of Classification Search .................. 333/181, 333/185; 361/748
See application file for complete search history.

(56) References Cited

U.S. PATENT DOCUMENTS

| | | | |
|---|---|---|---|
| 5,068,631 A * | 11/1991 | Vince | 333/181 |
| 5,488,540 A * | 1/1996 | Hatta | 361/794 |
| 6,281,697 B1 | 8/2001 | Masuda et al. | |
| 6,297,965 B1 * | 10/2001 | Sasaki et al. | 361/782 |
| 6,515,868 B1 | 2/2003 | Sasaki et al. | |
| 7,061,772 B2 * | 6/2006 | Arai et al. | 361/783 |
| 2002/0153166 A1 | 10/2002 | Chang | |

FOREIGN PATENT DOCUMENTS

| | | |
|---|---|---|
| JP | 10-223997 A | 8/1998 |
| JP | H11-307894 | 11/1999 |
| JP | 2000-171504 | 6/2000 |
| JP | 2001-119110 | 4/2001 |
| JP | 2001-141793 | 5/2001 |
| JP | 3170797 B2 | 5/2001 |
| JP | 3327714 B2 | 9/2002 |
| JP | 2002-368355 | 12/2002 |
| JP | 2005-183790 A | 7/2005 |
| JP | 2005-302885 A | 10/2005 |

\* cited by examiner

*Primary Examiner* — Robert Pascal
*Assistant Examiner* — Kimberly E Glenn
(74) *Attorney, Agent, or Firm* — Birch, Stewart, Kolasch & Birch, LLP.

(57) ABSTRACT

One end of a power-supply bus is connected to a power supply through a ferrite bead. The power-supply bus is connected to power-supply terminals. The power-supply terminals are connected at positions in such a manner that a terminal with a higher intensity is connected closer to the other end of the power-supply bus. Ground terminals are connected to ground. Capacitors are bypass capacitors or decoupling capacitors, for example, and connected between respective power-supply terminals and ground.

20 Claims, 4 Drawing Sheets

DEVICE AND CONNECTING METHOD FOR CONNECTING POWER-SUPPLY TERMINALS TO A POWER-SUPPLY BUS BASED ON NOISE INTENSITIES

TECHNICAL FIELD

The present invention relates to a device and a connecting method, and particularly to the connection of an integrated circuit to a power-supply bus.

BACKGROUND ART

An integrated circuit has power-supply terminals, and is driven by electric power supplied to the power-supply terminals. In order to supply the power to the power-supply terminals, the power-supply terminals are connected through a power-supply bus to a power supply as the source of the power.

When the integrated circuit is driven, noise occurs in the integrated circuit, and the noise leaks from the power-supply terminals. Accordingly, capacitors are connected to the power-supply terminals to reduce the leakage of noise.

Techniques related to the present invention are shown below.
Patent Document 1: Japanese Patent Application Laid-Open No. 2005-302885
Patent Document 2: Japanese Patent No. 3170797
Patent Document 3: Japanese Patent No. 3327714

DISCLOSURE OF THE INVENTION

Problems to be Solved by the Invention

However, the noise intensities differ at individual power-supply terminals. Accordingly, the noise intensities in some power-supply terminals may be high, and it may be difficult to reduce the noise only with the capacitors connected to the power-supply terminals. The noise may flow into the power supply and affect the power supply.

The present invention has been made by considering the conditions above, and an object of the present invention is to prevent noise flowing in power-supply terminals from leaking to a power supply.

Means for Solving the Problems

According to a first aspect of the device of the present invention, a device comprises: a plurality of power-supply terminals (P11, P21, P31, P41); an integrated circuit (11) that is connected to said plurality of power-supply terminals; and a power-supply bus (2) having one end (r20) connected to a power supply (Vc), and the other end (r201), wherein said plurality of power-supply terminals are connected to said power-supply bus in such a manner that each of ones having noise of a higher intensity (a1 to a4) contained in a current flowing in itself is connected to said power-supply bus at a position (r21 to r24) closer to said other end.

According to a second aspect of the device of the present invention, the device of the first aspect further comprises a plurality of noise removing portions (C1 to C4) connected between respective ones of said power-supply terminals and another power supply (GND).

According to a third aspect of the device of the present invention, the device of the first aspect further comprises at least one noise removing portion (C2 to C4) connected between another power supply (GND) and only at least one power-supply terminal (P21, P31, P41) other than a power supply terminal (P11) that is connected at a position (r24) that is the closest to said other end (r201) in said plurality of power-supply terminals.

According to a fourth aspect of the device of the present invention, in the device of the second aspect, said noise removing portions (C1 to C4) are capacitors.

According to a fifth aspect of the device of the present invention, in the device of the third aspect, said at leat one noise removing portion (C1 to C4) is a capacitor.

According to a sixth aspect of the device of the present invention, in the device of the fourth aspect, a resonance frequency determined by one of said capacitors (C1 to C4) and said power-supply bus (2) differs from a resonance frequency determined by another of said capacitors and said power-supply bus.

According to a seventh aspect of the device of the present application, in the device of the fifth aspect, said at least one noise removing portion is a plurality of noise resonance frequency determined by one of said capacitors (C1 to C4) and said power-supply bus (2) differs from a resonance frequency determined by another of said capacitors and said power-supply bus.

According to an eighth aspect of the device of the present invention, in the device of any of the first to seventh aspects, the one end (r20) of said power-supply bus (2) is connected to said power supply (Vc) through a second noise removing portion (3).

According to a ninth aspect of the device of the present invention, in the device of the eighth aspect, said second noise removing portion (3) is a ferrite bead.

According to a tenth aspect of the device of the present invention, the device of any of the first to ninth aspects further comprises: an interconnection (1012) connected to ground; and a multilayer stacked substrate (101) in which said power-supply bus (2) and said interconnection are stacked with an insulating substrate therebetween, wherein said integrated circuit (11) is provided on said multilayer stacked substrate on a side of said power-supply bus, and a distance (d) between said integrated circuit and said interconnection is not more than 1 mm in a direction (90) of stacking of said multilayer stacked substrate.

According to an eleventh aspect of the device of the present invention, the device of any of the first to tenth aspects further comprises: a substrate (102); and an interconnection (A1) connected to ground, wherein said integrated circuit (11) is provided on a surface of the substrate, and said interconnection is provided on the same said surface with said integrated circuit, and surrounds said integrated circuit and said power-supply terminals (P11, P21, P31, P41).

According to a first aspect of the connecting method of the present invention, a device comprises: a plurality of power-supply terminals (P11, P21, P31, P41); an integrated circuit (11) that is connected to said plurality of said power-supply terminals; and a power-supply bus (2) having one end (r20) connected to a power supply (Vc), and the other end (r201), and said connecting method is a method for connecting said power-supply terminals of said device to said power-supply bus, wherein said power-supply terminals are connected to said power-supply bus in such a manner that one having noise of a higher intensity (a1 to a4) contained in a current flowing in itself is connected to said power-supply bus at a position (r21 to r24) closer to said other end.

According to a second aspect of the connecting method of the present invention, the connecting method of the first aspect comprises: connecting said power-supply terminals (P11, P21, P31, P41) to a power-supply bus (21) prepared separately from said power-supply bus (2), and supplying a power supply (Vc) to said integrated circuit (11); previously measuring intensities (a1 to a4) of noises of currents respectively flowing in said power-supply terminals; and determining said positions (r21 to r24) at which said power-supply terminals are connected to said power-supply bus on the basis of the intensities of noises.

Effects of the Invention

According to the first aspect of the device of the present invention, or the first aspect of the connecting method, noise of a higher intensity at a power-supply terminal flows a longer distance in the power-supply bus to the one end of the power-supply bus, so that the inductance between that power-supply terminal and the one end of the power-supply bus is larger. It is thus possible to reduce a high region of noise leaking to the power supply connected to that one end.

According to the second aspect of the device of the present invention, it is possible to reduce noise flowing from the power-supply terminals to the power-supply bus.

According to the third aspect of the device of the present invention, no noise removing portion is connected between that another power supply and the power-supply terminal connected at a position closest to the other end, and it is thus possible to prevent increase in the amount of current flowing from that power-supply terminal to the power-supply bus. Therefore the intensity of the noise contained in that current is less likely to become large.

According to the fourth or fifth aspect of the device of the present invention, the capacitors form low-pass filters together with the parasitic inductors of interconnections such as the power-supply terminals and the power-supply bus. It is thus possible to remove more noise, and to further reduce the leakage of noise to the power supply.

According to the sixth or seventh aspect of the device of the present invention, low-pass filters with different resonance frequencies are obtained, making it possible to expand the frequency band in which removal is possible.

According to the eighth or ninth aspect of the device of the present invention, it is possible to remove noise leaking to the one end of the power-supply bus, and to further reduce the leakage of noise to the power supply.

According to the tenth aspect of the device of the present invention, the distance between the integrated circuit and the interconnection is short, so that the electric field flowing from either one to the other of the integrated circuit and the interconnection can easily flow between the integrated circuit and the interconnection. This reduces the leakage of noise due to the electric field.

According to the eleventh aspect of the device of the present invention, it is possible to reduce the leakage of noise to the outside by causing noise occurring in the integrated circuit to flow to the interconnection. Also, the interconnection can have a large area around the integrated circuit, and the leakage of noise to the outside can be further reduced.

According to the second aspect of the connecting method of the present invention, the positions at which the power-supply terminals are connected to the power-supply bus can be determined by previously measuring the noise intensities.

These and other objects, features, aspects and advantages of the present invention will become more apparent from the following detailed description of the present invention when taken in conjunction with the accompanying drawings.

BEST MODE FOR CARRYING OUT THE INVENTION

First Preferred Embodiment

Figure 1:
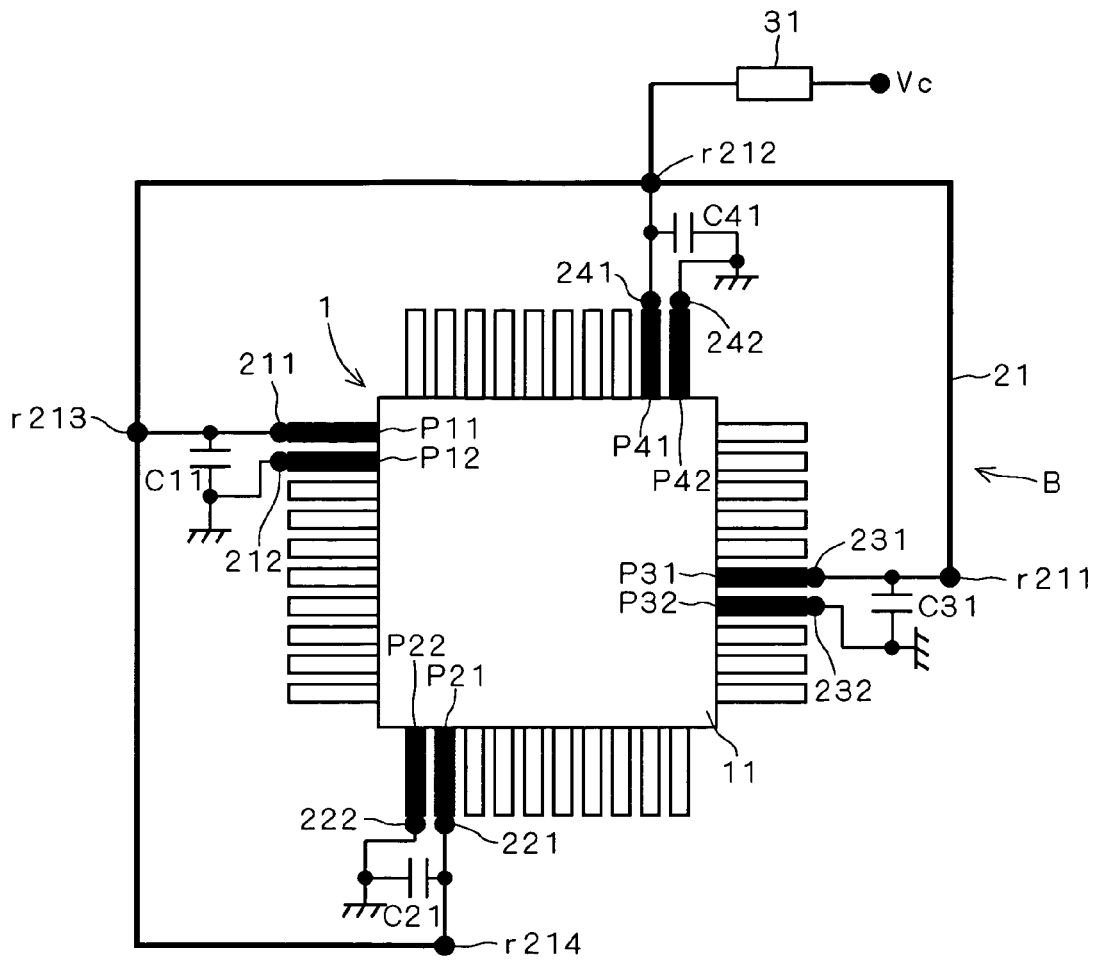
FIG. 1 is a diagram illustrating a noise-measurement circuit B that is described in a first preferred embodiment.
Figure 2:
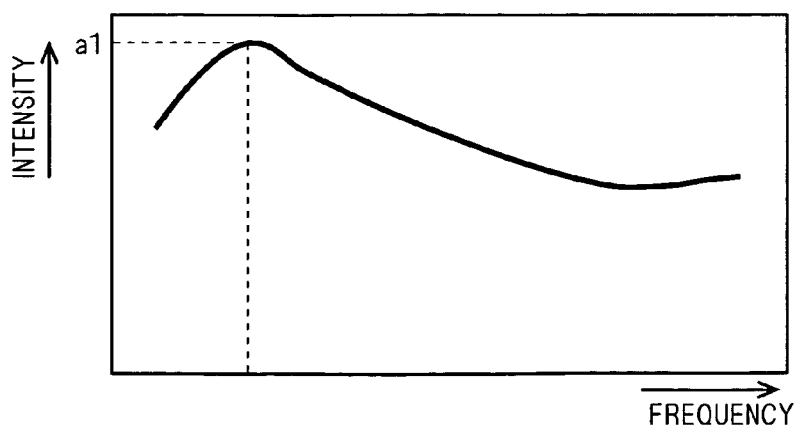
FIG. 2 is a diagram illustrating a spectrum of noise.
Figure 3:
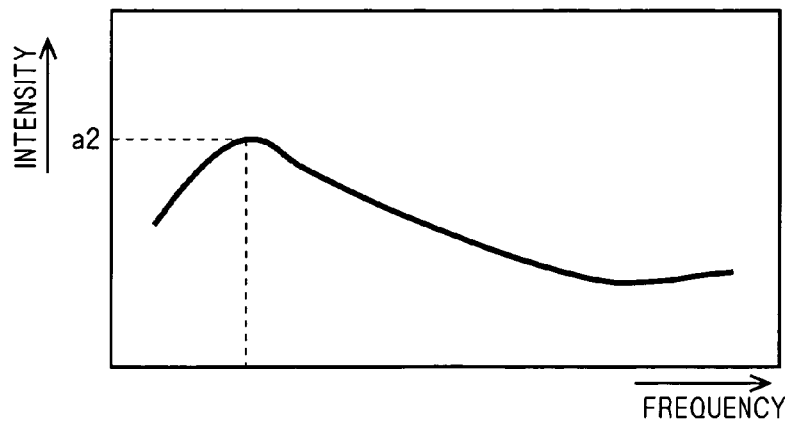
FIG. 3 is a diagram illustrating a spectrum of noise.
Figure 4:
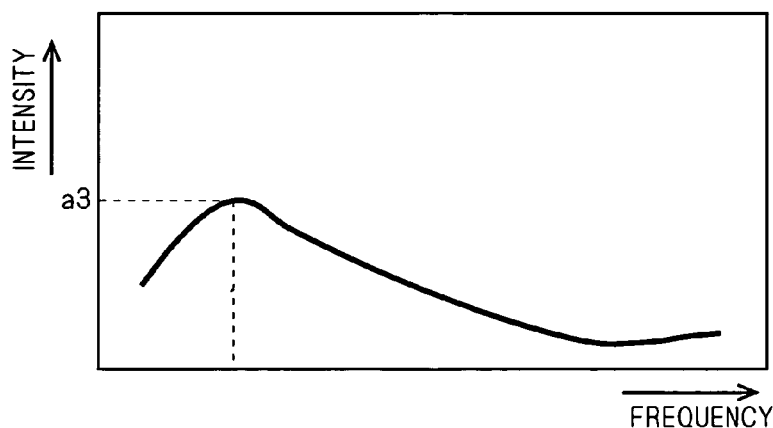
FIG. 4 is a diagram illustrating a spectrum of noise.
Figure 5:
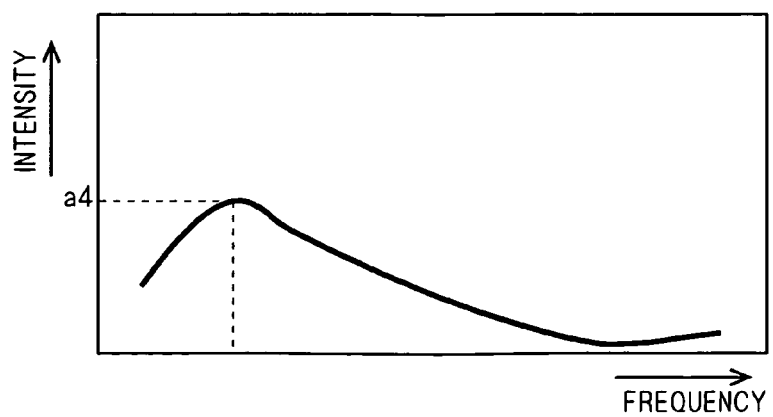
FIG. 5 is a diagram illustrating a spectrum of noise.
Figure 6:
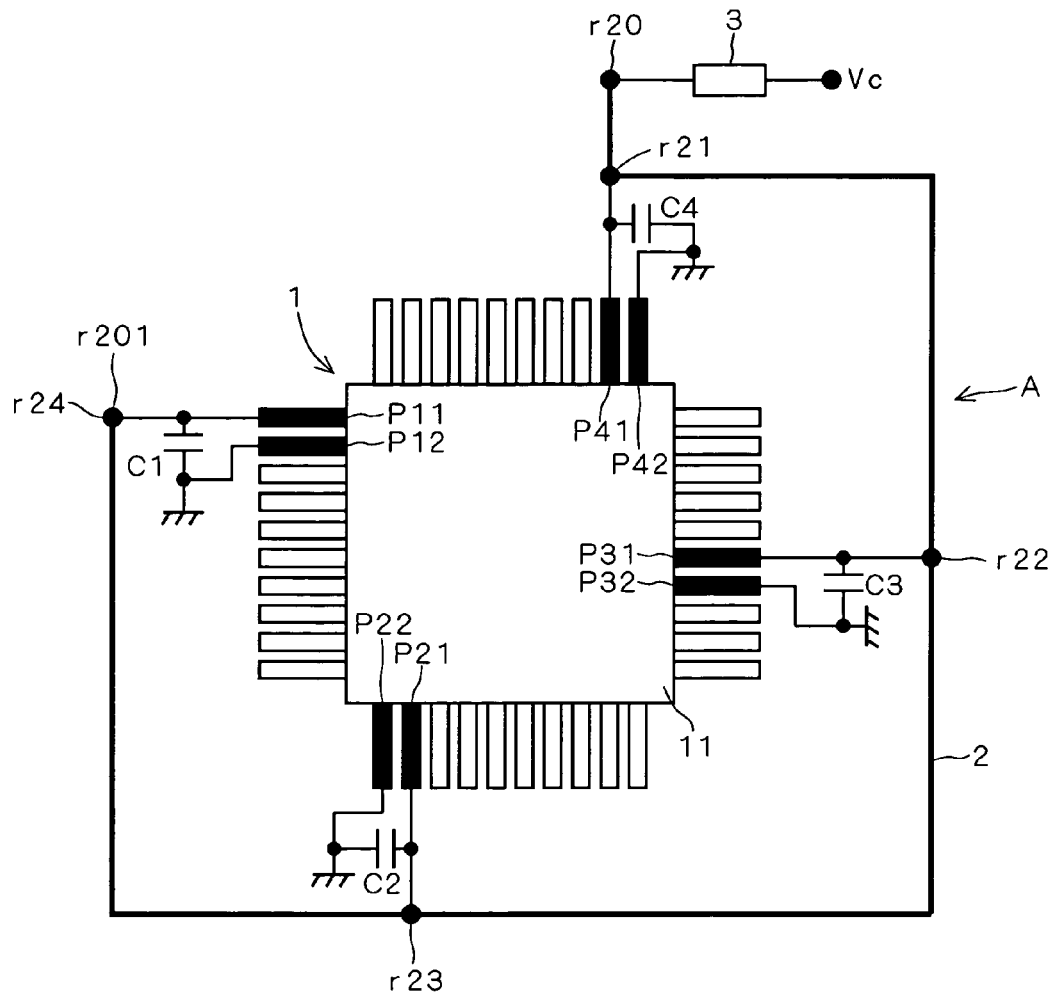
FIG. 6 is a diagram illustrating a connection provided after a circuit A has been configured.

A method for connecting a component 1 to a power-supply bus 2 according to this preferred embodiment will be described referring to FIGS. 1 to 6. The component 1 has an integrated circuit 11 and a plurality of terminals (FIGS. 1 and 6). The terminals include power-supply terminals P11, P21, P31, P41 and ground terminals P12, P22, P32, P42. The integrated circuit 11 is a high-speed digital integrated circuit, for example, and is connected to the power-supply terminals P11, P21, P31, P41 and the ground terminals P12, P22, P32, P42.

First, noises respectively flowing in the power-supply terminals P11, P21, P31, P41 are measured. The noises are measured by the procedure below.

Firstly, the component 1 is provided in a noise-measurement circuit B (FIG. 1).

The noise-measurement circuit B has a power supply Vc, a power-supply bus 21, capacitors C11 to C41, a ferrite bead 31, and terminals 211, 212, 221, 222, 231, 232, 241, 242.

The terminal 231 is connected to one end r211 of the power-supply bus 21. The terminals 241, 211, 221 are connected to positions r212, r213, r214 of the power-supply bus 21 in this order, sequentially from the one end r211.

The power supply Vc is connected to the power-supply bus 21 through the ferrite bead 31. It is connected to the position r212 in this preferred embodiment.

The terminals 212, 222, 232, 242 are connected to ground, with the capacitors C11 to C41 connected respectively between them and the terminals 211, 221, 231, 241.

The power-supply terminals P11, P21, P31, P41 are connected respectively to the terminals 211, 221, 231, 241. The ground terminals P12, P22, P32, P42 are connected respectively to the terminals 212, 222, 232, 242.

Secondary, the integrated circuit 11 is driven by the noise-measurement circuit B, and noises flowing in the power-supply terminals P11, P21, P31, P41 are measured. More specifically, the currents flowing respectively in the power-supply terminals P11, P21, P31, P41 are measured with a magnetic probe, for example. Then, the measurements are, e.g., spectrum-analyzed, to measure the intensities of noises contained in the currents.

FIGS. 2 to 5 respectively illustrate the results of spectrum analysis of the currents measured at the power-supply terminals P11, P21, P31, P41, with respect to the frequency. The maximum values of spectrum intensity are shown respectively as symbols a1 to a4. FIGS. 2 to 5 show an example in which the maximum value a1 is the largest and the maximum values a2 to a4 become smaller in this order.

Figure 7:
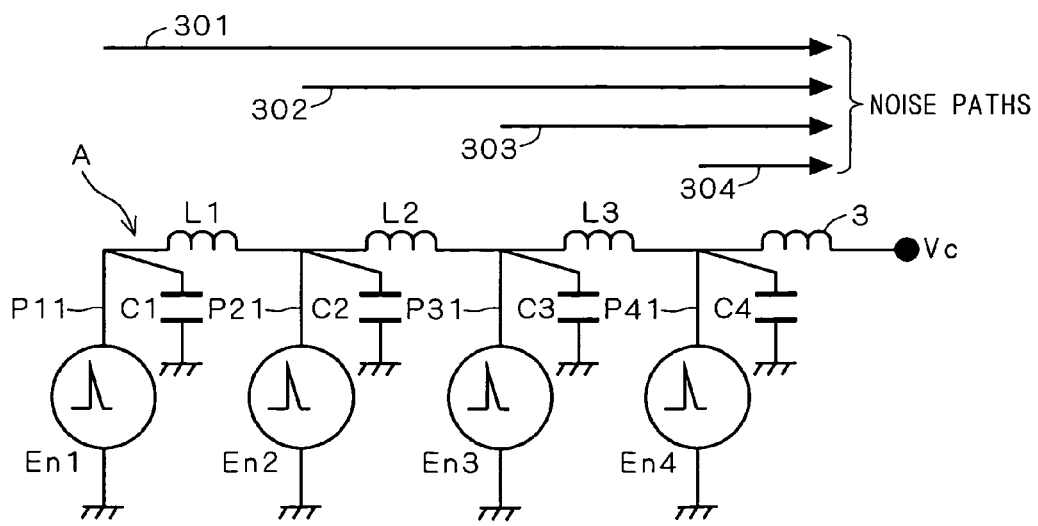
FIG. 7 is a circuit diagram illustrating the connection provided after the circuit A has been configured.

After the noise measurement, the component 1 is removed from the noise-measurement circuit B, and a circuit A is configured for the component 1 on the basis of the maximum values a1 to a4 discussed above. The configuration of the circuit A will now be described referring to FIGS. 6 and 7. FIG. 6 shows the connection aspect obtained after the circuit A has been configured, and FIG. 7 shows its circuit diagram. In FIG. 7, symbols En1 to En4 respectively represent the noise sources that generate the noises flowing in the power-supply terminals P11, P21, P31, P41.

The circuit A has a power supply Vc, a power-supply bus 2, capacitors C1 to C4, and a ferrite bead 3.

One end r20 of the power-supply bus 2 is connected to the power supply Vc through the ferrite bead 3. The ferrite bead 3 is capable of reducing the noise leaking from the one end r20, and thus reducing the leakage of noise to the power supply Vc. Accordingly, the ferrite bead 3 can be regarded as a noise removing portion. The noise removing portion is not limited to the ferrite bead 3, as long as it can reduce noise. For example, a capacitor may be used, and connected between the one end r20 and ground. In this case, it is desirable, also in the noise-measurement circuit B, to connect a capacitor in place of the ferrite bead 31.

The power-supply bus 2 is connected to the power-supply terminals P1, P21, P31, P41. The power-supply terminals P11, P21, P31, P41 are connected at the positions r24, r23, r22, r21 in such a manner that terminals with higher intensities a1 to a4 are connected closer to the other end r201 of the power-supply bus 2. The ground terminals P12, P22, P32, P42 are connected to ground.

The capacitors C1 to C4 are bypass capacitors or decoupling capacitors, for example, and connected respectively between the power-supply terminals P11, P21, P31, P41 and ground. The capacitors C1 to C4 are capable of reducing the noises flowing respectively from the power-supply terminals P11, P21, P31, P41 to the power-supply bus 2. Accordingly, the capacitors C1 to C4 can be regarded as noise removing portions. The noise removing portions are not limited to the capacitors C1 to C4, as long as they are capable of removing the noises En1 to En4. For example, a ferrite bead may be used and interposed between the position r24 of the power-supply bus 2 and the power-supply terminal P11. In this case, also in the noise-measurement circuit B, it is desirable to use ferrite beads in place of the capacitors C11, C21, C31, C41. More specifically, a ferrite bead is interposed between the position r213 and the power-supply terminal P111.

However, adopting the capacitors C1 to C4 as the noise removing portions makes it possible to remove more noise, because they form low-pass filters together with the parasitic inductors of interconnections including the power-supply terminals P111, P21, P31, P41, the power-supply bus 2, and the like. In FIG. 7, the parasitic inductors are shown as symbols L1 to L3.

According to the connecting method and the device provided after the connection has been made (FIG. 6), noises of higher intensities at the power-supply terminals P1, P21, P31, P41 flow longer distances in the power-supply bus 2 to the one end r20 by connecting the power-supply terminals P11, P21, P31, P41 having noises with high intensities a1 to a4 to the power-supply bus 2 at the positions r24, r23, r22, r21 located from the other end r201 toward one end r20 in this order. That is, the power-supply terminals P11, P21, P31, P41 are connected to the one end r20 in such a manner that a terminal where a current with larger noise flows is connected through a larger inductance. It is thus possible to reduce a high region of noise.

This effect discussed above can be obtained even in the absence of the ferrite bead 3 and the capacitors C1 to C4. However, connecting the noise removing portions as described above enables the removal of larger amounts of noise.

Also, noise removing portions such as the capacitors C2 to C4 may be connected only between ground and the power-supply terminals P21, P31, P41, excepting the power-supply terminal P11 connected at the position r24 that is the closest to the other end r201. In this case, no noise removing portion is connected between the power-supply terminal P11 and ground, and so it is possible to prevent increase in the amount of current flowing from the power-supply terminal P11 to the power-supply bus 2. Then the intensity of noise contained in that current is less likely to become large.

In this preferred embodiment, the noise flowing in the power-supply terminal P11 (i.e. the noise generated from the noise source En1) flows in the power-supply bus 2 to the one end r20 sequentially through the capacitors C1 to C4. FIG. 7 shows this as a path of noise with an arrow 301.

The noise flowing in the power-supply terminal P21 (FIG. 3) flows in the power-supply bus 2 to the one end r20 sequentially through the capacitors C2 to C4. The noise flowing in the power-supply terminal P31 (FIG. 4) flows in the power-supply bus 2 to the one end r20 sequentially through the capacitors C3 and C4. The noise flowing in the power-supply terminal P41 (FIG. 5) flows in the power-supply bus 2 to the one end r20 only through the capacitor C4. FIG. 7 shows this as noise paths respectively with arrows 302-304.

Thus, noise of higher intensity is inputted to a larger number of low-pass filters, and so the leakage of noise to the power supply Vc can be reduced.

In this preferred embodiment, the resonance frequency determined by one of the capacitors C1 to C4 and the power-supply bus 2 may differ from the resonance frequency determined by another of the capacitors C1 to C4 and the power-supply bus 2. This expands the frequency band where removal is possible.

Second Preferred Embodiment

Figure 8:
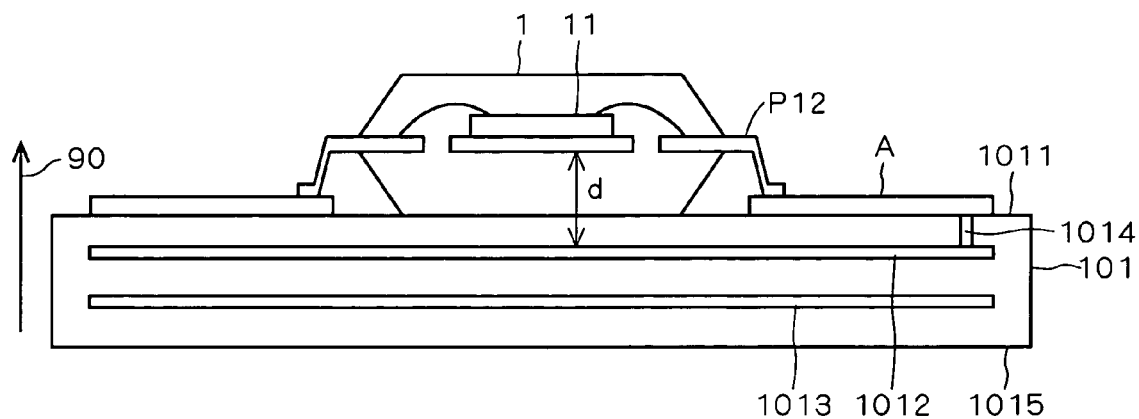
FIG. 8 is a cross-sectional view conceptually showing an integrated circuit 11 provided on a substrate 101.

FIG. 8 is a cross-sectional view conceptually illustrating the integrated circuit 11 provided on a substrate 101. The circuit A of the first preferred embodiment is constructed on a surface 1011 of the substrate 101 on which the component 1 is provided, for example.

A multilayer stacked substrate may be adopted as the substrate 101, for example, and FIG. 8 shows such a case. The multilayer stacked substrate has a power plane 1013 and a ground plane 1012. The power-supply bus 2, the ground plane 1012, and the power plane 1013 are stacked in this order from the surface 1011 side to the opposite surface 1015 side, with insulating substrates between them.

The ground terminal P12 is connected to the ground plane 1012 through a via 1014. Though not shown in FIG. 8, the ground terminals P22, P32, P42 are also connected to the ground plane 1012. The power-supply terminals P11, P21, P31, P41 are connected to the power supply Vc through the power-supply bus 2 and the power plane in this order.

When the component 1 is provided on the surface 1011 of the multilayer stacked substrate discussed above, it is desired that the distance d between the integrated circuit 11 and the ground plane 1012 be not more than 1 mm in a direction 90 of stacking of the multilayer stacked substrate. This is because, by setting the distance d small between the integrated circuit 11 and the ground plane 1012, the electric field flowing from either one to the other of the integrated circuit 11 and the ground plane 1012 can easily flow between the integrated circuit 11 and the ground plane 1012. This reduces the leakage of noise due to the electric field.

Figure 9:
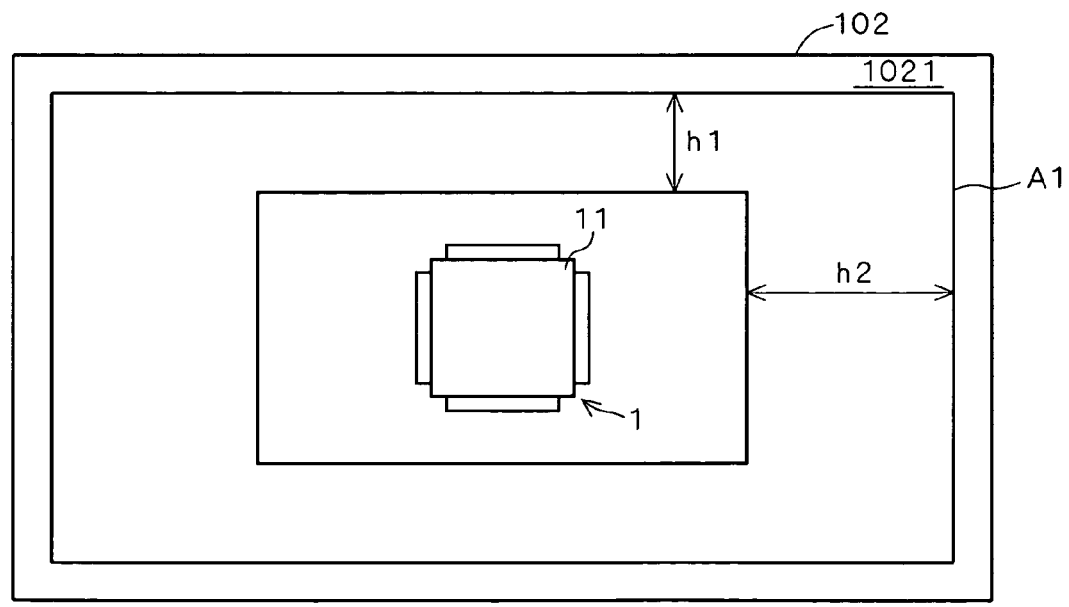
FIG. 9 is a top view conceptually showing an integrated circuit 11 provided on a substrate 102.

FIG. 9 is a top view conceptually illustrating the integrated circuit 11 provided on a substrate 102. A multilayer stacked substrate as described above may be adopted as the substrate 102, for example.

In FIG. 9, the component 1 is provided on a surface 1021 of the substrate 102. A ground pattern A1 is provided on the same surface 1021 with the component 1 and surrounds the component 1. In other words, the ground pattern A1 surrounds the integrated circuit 11 and the power-supply terminals P11, P21, P31, P41.

According to this structure, it is possible to reduce the leakage of noise to the outside by causing noise occurring in the integrated circuit 11 to flow to the ground pattern. Also, the ground pattern can have a large area around the integrated circuit 11, and so the leakage of noise to the outside can be further reduced. More desirably, the widths h1 and h2 of the ground pattern are not less than 4 mm.

While the invention has been described in detail, the foregoing description is in all aspects illustrative and not restrictive. It is understood that numerous other modifications and variations can be devised without departing from the scope of the invention.

The invention claimed is:

1. A device comprising:
a plurality of power-supply terminals;
an integrated circuit that is connected to said plurality of said power-supply terminals; and
a power-supply bus having one end connected to a power supply, and one other end,
said plurality of power-supply terminals being connected to said power-supply bus in such a manner that one of the plurality of power supply, terminals, relative to, other one of the plurality of power supply terminals, having noise of a higher intensity contained in a current flowing in itself is connected to said power-supply bus at a position closer to said one other end.

2. The device according to claim 1, further comprising a plurality of noise removing portions connected between respective ones of said plurality of power-supply terminals and another power supply.

3. The device according to claim 1, further comprising at least one noise removing portion connected, wherein a power-supply terminal with highest noise intensity in said plurality of power-supply terminals is connected to another power supply via said at least one noise removing portion, whereas at least one power-supply terminal not having highest noise intensity in said plurality power-supply terminals is connected to said another power supply by said at least one noise removing portion.

4. The device according to claim 2, wherein said plurality of noise removing portions are capacitors.

5. The device according to claim 3, wherein said at least one noise removing portion is a capacitor.

6. The device according to claim 4, wherein a resonance frequency determined by one of said capacitors and said power-supply bus differs from a resonance frequency determined by another of said capacitors and said power-supply bus.

7. The device according to claim 5, wherein said at least one noise removing portion is a plurality of noise removing portions, and said plurality of noise removing portions are capacitors, and a resonance frequency determined by one of said capacitors and power-supply bus differs from a resonance frequency determined by another of said capacitors and said power-supply bus.

8. The device according to claim 1, wherein the one end of said power-supply bus is connected to said power supply through a second noise removing portion.

9. The device according to claim 8, wherein said second noise removing portion is a ferrite bead.

10. The device according to claim 1, further comprising:
an interconnection connected to ground; and
a multilayer stacked substrate in which said power-supply bus and said interconnection are stacked with an insulating substrate therebetween,
wherein said integrated circuit is provided on said multilayer stacked substrate on a side of said power-supply bus, and
a distance between said integrated circuit and said interconnection is not more than 1 mm in a direction of stacking of said multilayer stacked substrate.

11. The device according to claim 8, further comprising:
an interconnection connected to ground; and
a multilayer stacked substrate in which said power-supply bus and said interconnection are stacked with an insulating substrate therebetween,
wherein said integrated circuit is provided on said multilayer stacked substrate on a side of said power-supply bus, and
a distance between said integrated circuit and said interconnection is not more than 1 mm in a direction of stacking of said multilayer stacked substrate.

12. The device according to claim 9, further comprising:
an interconnection connected to ground; and
a multilayer stacked substrate in which said power-supply bus and said interconnection are stacked with an insulating substrate therebetween,
wherein said integrated circuit is provided on said multilayer stacked substrate on a side of said power-supply bus, and
a distance between said integrated circuit and said interconnection is not more than 1 mm in a direction of stacking of said multilayer stacked substrate.

13. The device according to claim 1, further comprising:
a substrate; and
an interconnection connected to ground,
wherein said integrated circuit is provided on a surface of the substrate, and
said interconnection is provided on the same said surface with said integrated circuit, and surrounds said integrated circuit and said power-supply terminals.

14. The device according to claim 2, further comprising:
a substrate; and
an interconnection connected to ground,
wherein said integrated circuit is provided on a surface of the substrate, and
said interconnection is provided on the same said surface with said integrated circuit, and surrounds said integrated circuit and said power-supply terminals.

15. The device according to claim 3, further comprising:
a substrate; and
an interconnection connected to ground,
wherein said integrated circuit is provided on a surface of the substrate, and
said interconnection is provided on the same said surface with said integrated circuit, and surrounds said integrated circuit and said power-supply terminals.

16. A connecting method, wherein a device comprises:
a plurality of power-supply terminals;
an integrated circuit that is connected to said plurality of said power-supply terminals; and a power-supply bus having one end connected to a power supply, and one other end, and wherein said connecting method is a method for connecting said plurality of power-supply terminals of said device to said power-supply bus, and said power-supply terminals are connected to said power-supply bus in such a manner that one of the plurality of power supply, terminals, relative to, other one of the plurality of power supply terminals, having noise of a higher intensity contained in a current flowing in itself is connected to said power-supply bus at a position closer to said one other end.

17. The connecting method according to claim 16, comprising:

connecting said plurality of power-supply terminals to a power-supply bus prepared separately from said power-supply bus, and supplying a power supply to said integrated circuit;

previously measuring intensities of noises of currents respectively flowing in said plurality of power-supply terminals; and determining said positions at which said plurality of power-supply terminals are connected to said power-supply bus on the basis of said intensities of noises.

18. The device according to claim 4, further comprising:

a substrate; and an interconnection connected to ground, wherein said integrated circuit is provided on a surface of the substrate, and said interconnection is provided on the same said surface with said integrated circuit, and surrounds said integrated circuit and said power-supply terminals.

19. The device according to claim 5, further comprising:

a substrate; and an interconnection connected to ground, wherein said integrated circuit is provided on a surface of the substrate, and said interconnection is provided on the same said surface with said integrated circuit, and surrounds said integrated circuit and said power-supply terminals.

20. The device according to claim 7, further comprising:

a substrate; and an interconnection connected to ground, wherein said integrated circuit is provided on a surface of the substrate, and said interconnection is provided on the same said surface with said integrated circuit, and surrounds said integrated circuit and said power-supply terminals.

* * * * *